(12) United States Patent
Chu et al.

(10) Patent No.: US 6,924,199 B2
(45) Date of Patent: Aug. 2, 2005

(54) METHOD TO FORM FLASH MEMORY WITH VERY NARROW POLYSILICON SPACING

(75) Inventors: Wen-Ting Chu, Kaohsiung (TW); Shih-Chang Liu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/719,722

(22) Filed: Nov. 21, 2003

(65) Prior Publication Data

US 2005/0112828 A1    May 26, 2005

(51) Int. Cl.⁷ .......................................... H01L 21/336
(52) U.S. Cl. ................... 438/296; 438/297; 438/257
(58) Field of Search .................. 438/296, 297, 438/424, 425, 257, 258, 259, 713, 244

(56) References Cited

U.S. PATENT DOCUMENTS

| | | | | |
|---|---|---|---|---|
| 5,893,757 A | * | 4/1999 | Su et al. ...................... | 438/713 |
| 6,060,375 A | * | 5/2000 | Owyang et al. .............. | 438/585 |
| 6,177,331 B1 | | 1/2001 | Koga .......................... | 438/424 |
| 6,222,225 B1 | * | 4/2001 | Nakamura et al. ........... | 257/315 |
| 6,342,451 B1 | | 1/2002 | Ahn ............................ | 438/406 |
| 6,514,868 B1 | | 2/2003 | Hui et al. .................... | 438/713 |
| 6,544,838 B2 | * | 4/2003 | Ranade et al. ............... | 438/244 |
| 6,649,473 B1 | * | 11/2003 | Lin et al. ..................... | 438/257 |
| 6,673,676 B2 | * | 1/2004 | Lin et al. ..................... | 438/257 |
| 6,677,224 B2 | * | 1/2004 | Tseng .......................... | 438/296 |
| 6,740,550 B2 | * | 5/2004 | Choi et al. ................... | 438/199 |
| 6,777,342 B2 | * | 8/2004 | Hwang ........................ | 438/706 |
| 6,812,095 B2 | * | 11/2004 | Taylor ......................... | 438/257 |
| 6,818,459 B2 | * | 11/2004 | Wack et al. .................. | 438/14 |

* cited by examiner

Primary Examiner—Michael Lebentritt
Assistant Examiner—Walter L. Lindsay Jr.
(74) Attorney, Agent, or Firm—Thomas, Kayden, Horstemeyer & Risley

(57) ABSTRACT

A new method to form a transistor gate in the manufacture of an integrated circuit device is achieved. The method comprises providing a substrate. A conductor layer is formed overlying the substrate with a dielectric layer therebetween. A masking layer is formed overlying the conductor layer. A resist layer is formed overlying the masking layer. The resist layer is patterned to thereby selectively expose the masking layer. The resist layer exhibits a first spacing between edges of the resist layer. The exposed masking layer is etched through to thereby selectively expose the conductor layer. The etched edges of the masking layer are tapered such that the masking layer exhibits a second spacing between the masking layer edges at the top surface of the conductor layer. The second spacing is less than the first spacing. The exposed conductor layer is etched through to thereby complete a transistor gate.

19 Claims, 5 Drawing Sheets

METHOD TO FORM FLASH MEMORY WITH VERY NARROW POLYSILICON SPACING

BACKGROUND OF THE INVENTION (1) Field of the Invention

The invention relates to a method to fabricate an integrated circuit device, and, more particularly, to a method to form very narrowly-spaced polysilicon lines in the manufacture of an integrated circuit device.

(2) Description of the Prior Art

Non-volatile memories are widely used in the art of electronics. Non-volatile memories, such as EEPROM and flash EEPROM, hold memory states even in the absence of a power supply while providing re-programmability. Typical non-volatile memory devices use a complex gate comprising a control gate and a floating gate. The control gate acts in similar fashion to a standard, MOS gate to control the channel-state (ON/OFF) of the transistor. The floating gate acts a charge storage structure. The relative charge-state of the floating gate controls the relative threshold voltage of the device. The device is constructed such that biases on the control gate, source, and drain will cause charge movement onto or off from the floating gate to thereby program or erase the device. Another set of biases on the control gate, source, and drain is used to read the state of cell ('0' or '1').

The memory device manufacturer strives to improve the performance and to reduce the cost of the non-volatile memory. To this end, much effort has been put forth to improve the coupling ratio between the control gate and floating gate to thereby reduce the programming and/or erasing speed. Much effort has been expended to reduce the size of each memory cell and the size of the array. Many novel devices and configurations have been reported in the art. In addition, advances in lithography technology allow smaller feature widths and spacings to be formed on the integrated circuit and to create more densely packed memory arrays.

Referring now to FIG. 1, a small part of a partially fabricated, non-volatile array 10 is shown in top view. The array 10 comprises EEPROM cells each comprising a single floating gate (FG) 30a, 30b, 30c, and 30d. Wordlines 26a and 26b run in columns and form the control gates for devices along those columns. The sources 18 and drains 22 of the devices run along the row directions. The sources 18 in a column are typically tied together in a source line by a metal layer, not shown. The drains 22 in a column are typically tied together as a bit line by a metal layer, also not shown. Split gate devices, where the control gate (wordline) overlies a part of the channel, are shown.

Of particular importance to the present invention and as shown in the example, the features are fabricated to minimal dimensions. The active areas (OD) in the substrate, where the device drain 22, source 18, and gates 26 and 30 are formed, are separated by isolation regions 14. In this case, the isolation regions are formed as shallow trench isolation (STI) regions 14. The STI regions 14 are formed at a minimal width and spacing. The STI region spacing is shown by dimension B. The floating gates 30a–30d, are designed at a width A1 that is somewhat smaller than the STI spacing B. By designing the FG width A smaller than the STI spacing B, a self-aligned floating gate is achieved.

Referring now to FIG. 2, a cross section of the memory array is shown. The STI regions 14 are formed as trenches filled with dielectric material 14 in the semiconductor substrate 12. The floating gates comprise a conductor layer 30, such as polysilicon, overlying a gate dielectric layer 28. The conductor layer 30 is formed as a conformal film overlying the gate dielectric layer 28 and the STI regions 14. Then the conductor layer 30 is patterned using a lithographic technique as is well known in the art. Because, the floating gate mask is made somewhat smaller than the STI spacing, the resulting floating gates 30 are formed between, but not overlying, the protruding STI dielectric material 14. This can result in a problem, however, because OD trenches 38 can be formed between the floating gates 30 and the STI regions 14. These trenches present gap-filling problems for subsequently deposited dielectric films and can cause device or floating gate leakage.

Referring now to FIG. 3, the prior art memory array 40 is again shown in top view. In this case, however, a non-self-aligned floating gate scheme is used. The floating gates 44a–44d are designed to have widths $A_2$ greater than the STI spacing B. This design choice means that the floating gates 44a–44d will have edges on the STI regions 14 such that the OD trench problem does not occur. However, the resulting space C' between the floating gates 44a–44d is less than the minimum width C of the STI region 14. Therefore, this non-self-aligned floating gate would require more precise, and expensive, photolithography and etching processes than in the self-aligned case.

To create these very narrowly-spaced floating gates 44a–44d, without increasing the photolithography process expense, a spacer-based hard mask has been used in the prior art. Referring now to FIG. 4a, the memory array integrated circuit is shown in cross section. Again, the conductor layer 44 is formed overlying the gate dielectric layer 28 and the STI regions 14. A hard mask layer 48 is deposited overlying the conductor layer 44. The hard mask layer 48 is then patterned to form masking polygons overlying the conductor layer 44 where the floating gates are planned. Note that the hard mask layer 48 is patterned with the larger spacings C corresponding to the STI region 14 spacings B. In this way, the hard mask patterning does not require more precise and expensive photolithography.

Referring now to FIG. 4B, spacers 52 are formed on the sidewalls of the hard mask layer 48 by, for example, depositing a film 52 and then anisotropically etching the film to remove it from the horizontal surfaces while leaving the spacers 52 on the vertical surfaces. Note that the spacers 52 increase the effective width of the hard mask 48 such that the combined masking polygons 48 and 52 have smaller spaces C'. These smaller spaces C' are achieved without a second photolithography process sequence. Referring now to FIG. 4C, the conductor layer 44 is etched through where exposed by the masking polygons 48 and 52 to complete the floating gates 44. The smaller spaces C' between the floating gates 44 are thereby achieved. While the approach does not require an expensive photolithography process, it does have the disadvantage of adding the sidewall spacer process, which includes a deposition and an etch, to the overall process flow.

Several prior art inventions relate to integrated circuit manufacturing, in general, and to nonvolatile memory device manufacture in particular. U.S. Pat. No. 6,342,451 B1 to Ahn discloses methods to form a floating gate. Sidewall spacers are used to define a floating gate pattern. U.S. Pat. No. 6,514,868 B1 to Hui et al teaches a method to form a contact hole. A tapered hard mask is used to define a contact hole opening. U.S. Pat. No. 6,177,331 B1 to Koga teaches an integrated circuit manufacturing method where a hard mask is tapered.

SUMMARY OF THE INVENTION

A principal object of the present invention is to provide an effective and very manufacturable method to form narrowly-spaced transistor gates in an integrated circuit device.

A further object of the present invention is to provide a method to form narrowly-spaced floating gates for non-volatile memory.

A yet further object of the present invention is to provide a method to form narrowly-spaced floating gates without extra precision photolithography processing.

A yet further object of the present invention is to provide a method to form narrowly-spaced floating gates without adding a spacer process.

A yet further object of the present invention is to provide a method to form narrowly-spaced floating gates without creating OD trenches.

In accordance with the objects of this invention, a method to form a transistor gate in the manufacture of an integrated circuit device is achieved. The method comprises providing a substrate. A conductor layer is formed overlying the substrate with a dielectric layer therebetween. A masking layer is formed overlying the conductor layer. A resist layer is formed overlying the masking layer. The resist layer is patterned to thereby selectively expose the masking layer. The resist layer exhibits a first spacing between edges of the resist layer. The exposed masking layer is etched through to thereby selectively expose the conductor layer. The etched edges of the masking layer are tapered such that the masking layer exhibits a second spacing between the masking layer edges at the top surface of the conductor layer. The second spacing is less than the first spacing. The exposed conductor layer is etched through to thereby complete a transistor gate.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form narrowly-spaced transistor gates in the manufacture of an integrated circuit device. The method performs a tapered etch of a thick hard mask. The resulting hard mask polygons have a smaller opening dimension at the conductor layer surface. As a further result, smaller transistor to transistor spacings can be etched using the hard mask polygons. It should be clear to those experienced in the art that the present invention can be applied and extended without deviating from the scope of the present invention.

Figure 5:
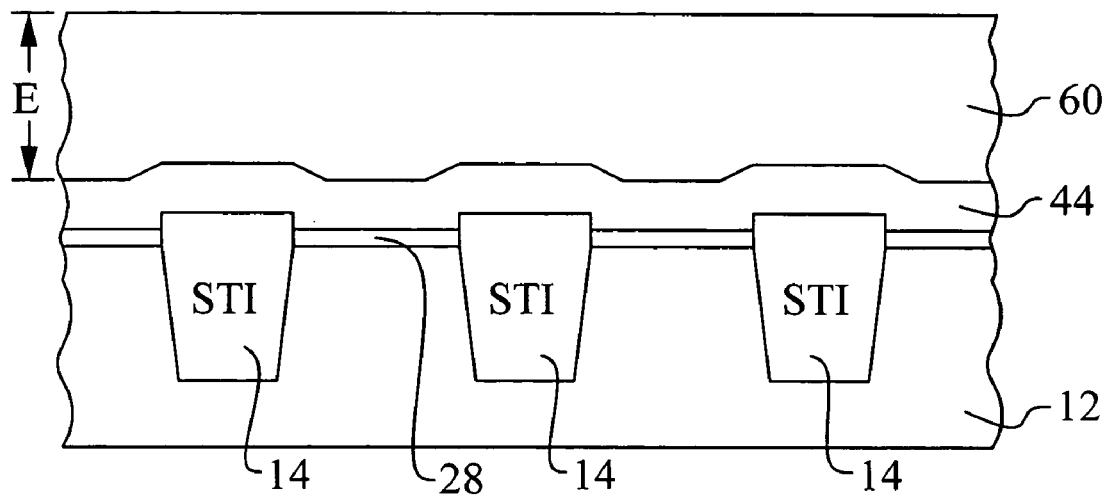
FIGS. 5 through 9 illustrate a preferred embodiment of the present invention.

Referring now to FIG. 5, a preferred embodiment of the present invention is illustrated. Several important features of the present invention are shown and discussed below. As in the prior art example of FIGS. 4a through 4c, FIG. 5 illustrates a cross section of the memory integrated circuit of FIG. 3. In FIG. 5, the partially completed device is shown where non-self-aligned floating gates are planned. The method of the present invention may be applied to the fabrication of any transistor, however.

A substrate 12 is provided. The substrate 12 preferably comprises a semiconductor material and, more preferably, comprises a monocrystalline silicon wafer as is well known in the art. Alternatively, the substrate 12 may comprise a silicon-on-insulator (SOI) as is also well known in the art. The substrate 12 is preferably doped with impurity ions such that it is lightly n-type or lightly p-type. Isolation regions 14 are formed in the substrate 12 to separate and electrically isolate active areas one from another. The isolation regions 14 preferably comprise shallow trench isolation (STI) regions as shown. STI regions 14 may be formed by any of the methods well known in the art. In simplified form, trenches are etched into the substrate 12. These trenches are then filled with a dielectric material, such as oxide. A planarization process may then be used to remove excess dielectric and to thereby confine this dielectric to the trench boundaries. The STI regions 14 are shown extending above the top surface of the substrate 12. This is the preferred embodiment but is not essential to the teachings of the present invention.

A dielectric layer 28 is formed overlying the substrate 12. This dielectric layer 28 is the gate dielectric layer for the planned floating gates. Preferably, the dielectric layer 28 comprises oxide and, more preferably, comprises silicon oxide. Other dielectric materials, such as metal oxides or metal nitride oxides, could be used. The oxide layer 28 may be grown by a thermal process, which is preferred, or may be deposited by a chemical vapor deposition (CVD) process. In the preferred embodiment, the dielectric layer is formed to a thickness of between about 70 Å and about 200 Å.

A conductor layer 44 is formed overlying the dielectric layer 28. The conductor layer 44 will form the floating gate electrodes on which the charge-state is held. The conductor layer 44 preferably comprises a polysilicon film. This polysilicon film 44 may be formed, for example, by a CVD or a low-pressure CVD (LP-CVD) process in which silicon vapor is generated from a precursor and then deposited onto the dielectric layer 28. The polysilicon layer 28 may be doped or non-doped. If doped, then this doping may be performed via an insitu introduction of dopant ions into the deposition process or via a subsequent ion implantation. The conductor layer 44 may comprises other materials. Metals, such as aluminum or aluminum alloys, could be used to form the conductor layer 44. The conductor layer 44 is preferably formed to a thickness of between about 300 Å and about 3,000 Å.

As an important feature of the present invention, a masking layer 60 is formed overlying the conductor layer 44. The masking layer 60 is used during the patterning of the conductor layer 44 to achieve very narrowly-spaced transistor gates. The masking layer 60 comprises a material that exhibits a slow etching rate when exposed to the process used to etch the conductor layer 44. This allows for a selective etching through of the conductor layer 44 while the masking layer 60 maintains its shape and dimensions such that a pattern is accurately transferred from the masking layer 60 to the conductor layer 44. The masking layer preferably comprises nitride and, more preferably, comprises silicon nitride. The silicon nitride layer 44 is preferably deposited using a CVD process. Other materials, such as silicon oxynitride, can be used as well. As a key feature, the masking layer 60 is deposited to a substantially greater thickness than the in the prior art. This greater thickness facilitates a tapered profile on the patterned edges of the masking layer 60 in the subsequent step is part of controlling the final pattern dimensions as will be described below.

Preferably, the masking layer 60 is deposited to a thickness E of between about 600 Å and about 4,000 Å.

Figure 6:
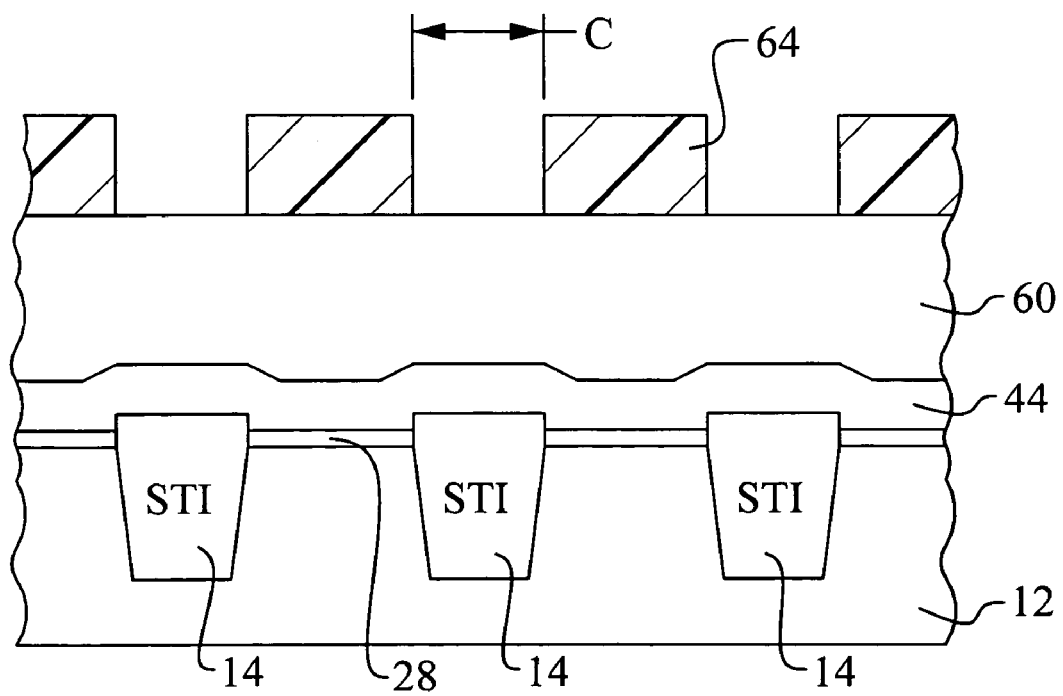

Referring now to FIG. 6, another important feature of the present invention is illustrated. A resist layer 64 is formed overlying the masking layer 60. The resist layer 64 is then patterned to thereby selectively expose the masking layer 60. The resist layer 64 preferably comprises a photosensitive resist, or photoresist, as is well known in the art. Photoresist 64 typically comprises an organic compound having a first phase of operation where polymer chains in the compound are non-cross linked and a second phase of operation where these polymer chains in the compound are cross linked. These phases of operation are controlled by the application of light, sometimes called actinic light, to the photoresist 64. In the patterning process, this actinic light is selectively applied to the photoresist layer 64 through a patterned mask. The photoresist layer 64 is then developed. In the developer, one phase, perhaps the non-cross linked, is removed while another phase, perhaps the cross linked, remains. As a result of this photolithographic process, a patterned of resist shapes 64 is formed overlying the surface of the masking layer 60.

As an important feature of the present invention, the resist layer 64 is patterned with spacings C that do not require the most expensive and precise exposure equipment and masks. For example, the spacings on the resist layer 64 are between about 0.05 $\mu$m and about 0.5 am. In the preferred embodiment, the resist layer 64 is patterned using a 248 nm photolithographic tool. Further, in the preferred case, the patterned edges of the resist layer 64 are designed to approximately align with the underlying boundary edges of the STI regions 14 as shown.

Figure 7:
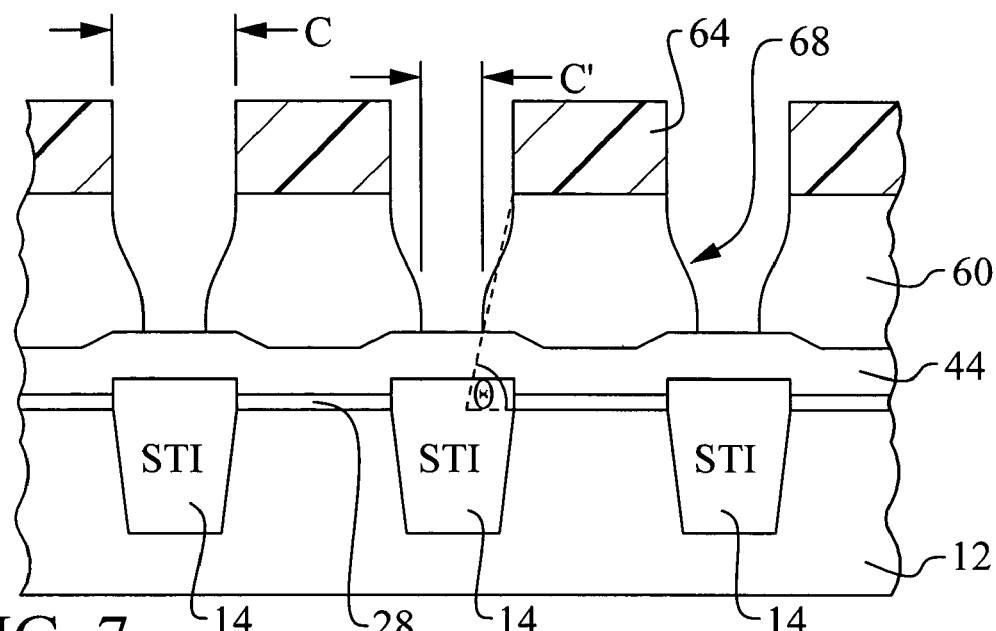

Referring now to FIG. 7, another important feature of the present invention is illustrated. The exposed masking layer 60 is etched through to thereby selectively expose the conductor layer 44. Most importantly, the etched edges 68 of the masking layer are tapered such that the exposed conductor layer 44 is of smaller area than the exposed masking layer 60 of the step of patterning the resist layer 64 shown in FIG. 6. In the previous resist layer 64 patterning step, the spacings C between the edges of the resist layer 64 roughly line up with the edges of the STI regions 14. However, as shown on FIG. 7, due to the tapered profile of the masking layer edges 68, the space C' between the masking layer edges at the surface of the conductor layer 44 is substantially smaller.

The etching process used to etch through the masking layer 60 has an etching characteristic with both vertical and horizontal components. As a result, the edges 68 of the masking layer 60 are not perpendicular with respect to the top surface of the substrate 12. Rather, the angle of the edges 68 of the masking layer 60, with respect to the top surface of the substrate, is between about 45° and about 85°. As a result of the non-perpendicular etching angle and of the large thickness of the masking layer 60, the patterned masking layer 60 exposes a smaller surface area of conductor layer 44 or, alternatively, exhibits a substantially smaller spacing dimension C' than the spacing dimension of the resist layer 64. In the preferred embodiment, the spacing C' of the masking layer 60 at the conductor layer 44 surface is between about 0.02 $\mu$m and about 0.5 $\mu$m. This is substantially smaller than the spacing capability of the 248 nm lithographic tool. The masking layer 60 is preferably etching using a dry process. An exemplary etching chemistry comprises $CFH_3$, $CF_4$, $O_2$, and He. For example, $CFH_3$ at about 20 SCCM, $CF_4$ at about 80 SCCM, $O_2$ at about 10 SCCM, and He at about 12 Torr.

Figure 8:
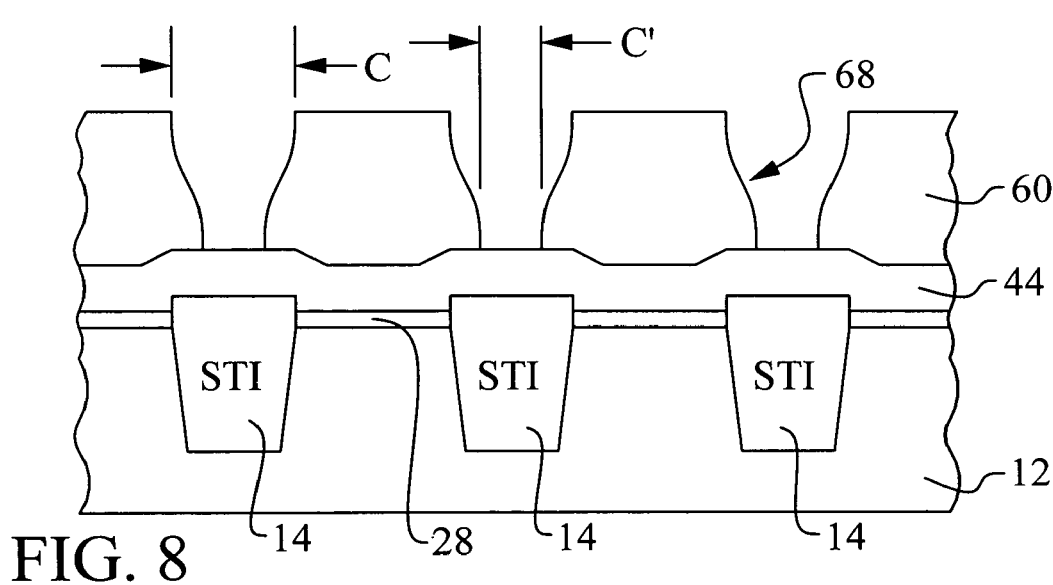

Referring now to FIG. 8, as an important feature of the present invention, the exposed conductor layer 44 is etched through to thereby complete the floating gates 44. The resulting, patterned conductor layer 44 has substantially smaller spacings C' than the spacings at the top surface of the masking layer 60. The conductor layer 44 is etched through using, for example, a dry etching process. Dry etching processes for selectively etching polysilicon while minimally etching silicon nitride are well known in the art. As a result of the above-described, novel, process, the floating gates 44 are patterned to a very narrowly-spaced dimension C'. This dimension C' exceeds the dimensional tolerance of the 248 lithographic tool used to achieve the pattern. Further, the process does not require the additional process complexity of the spacer process described in the prior art. It is not necessary to deposit two nitride layers and then to perform two nitride etches. A single nitride layer 60, in the preferred case, and etch is sufficient to achieve the smaller spacing C'.

Figure 1:
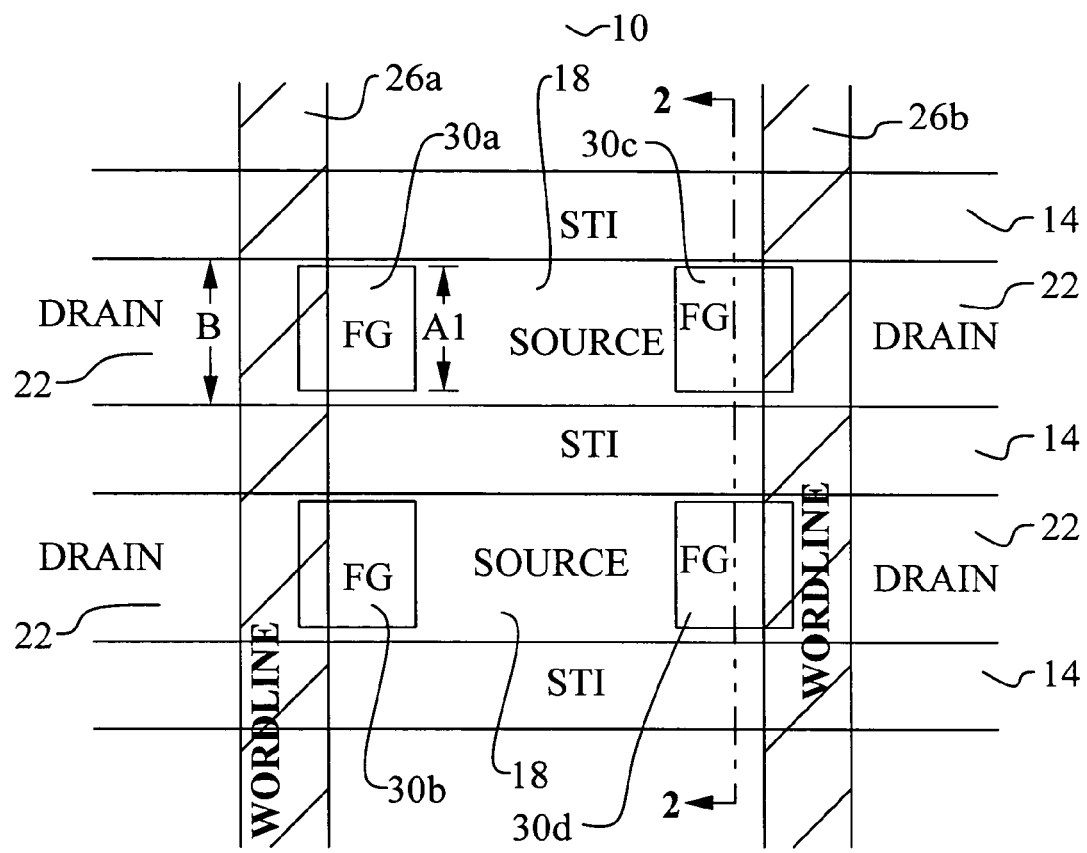
FIGS. 1 through 3 and 4A through 4C illustrate prior art methods to form a floating gate in the manufacture of an integrated circuit device.
Figure 2:
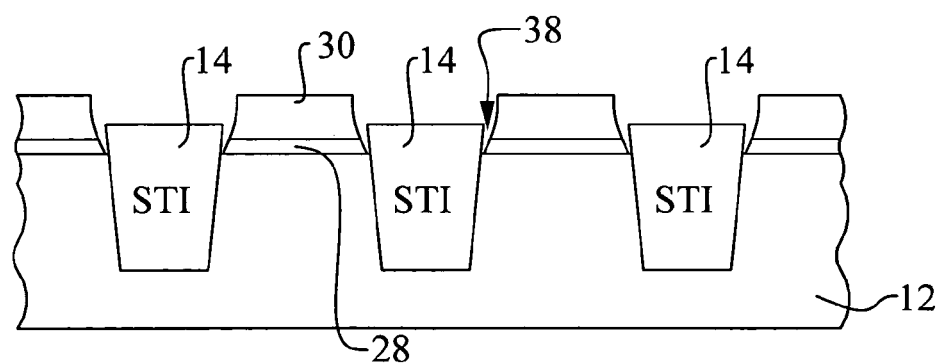
Figure 3:
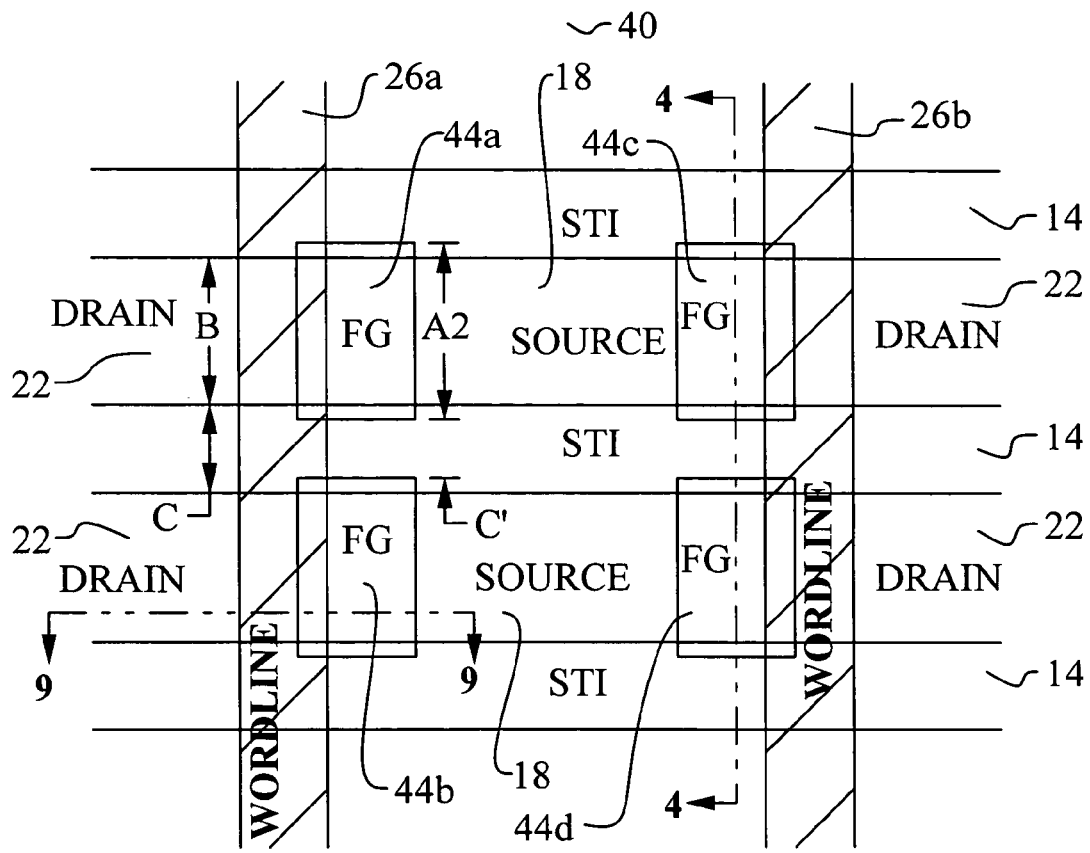
Figure 4A:
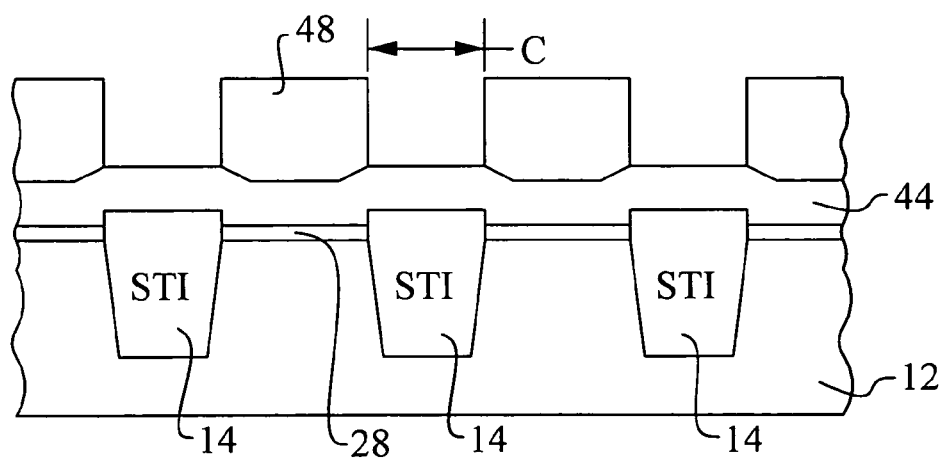
Figure 4B:
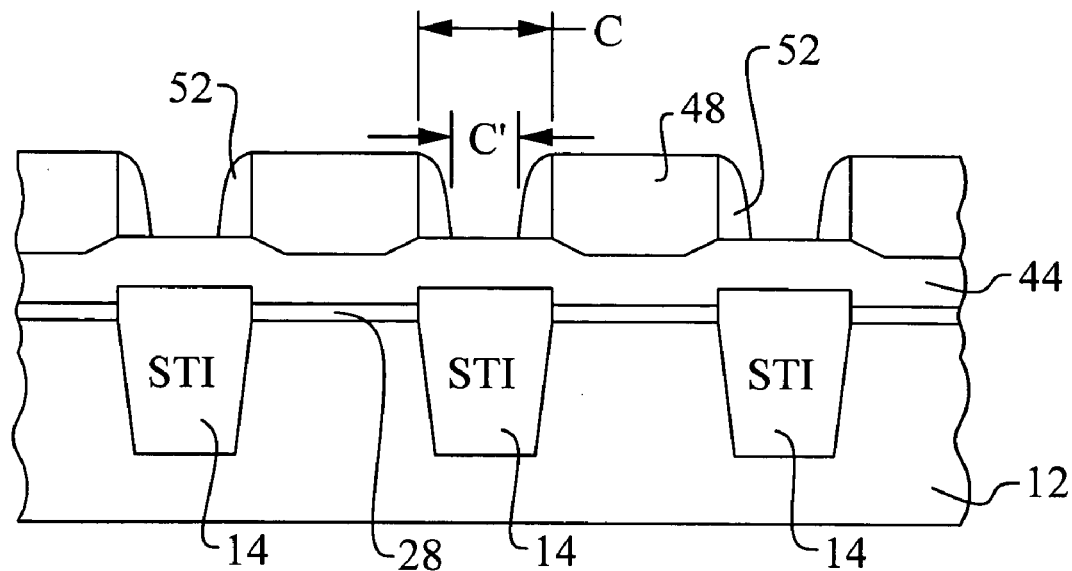
Figure 4C:
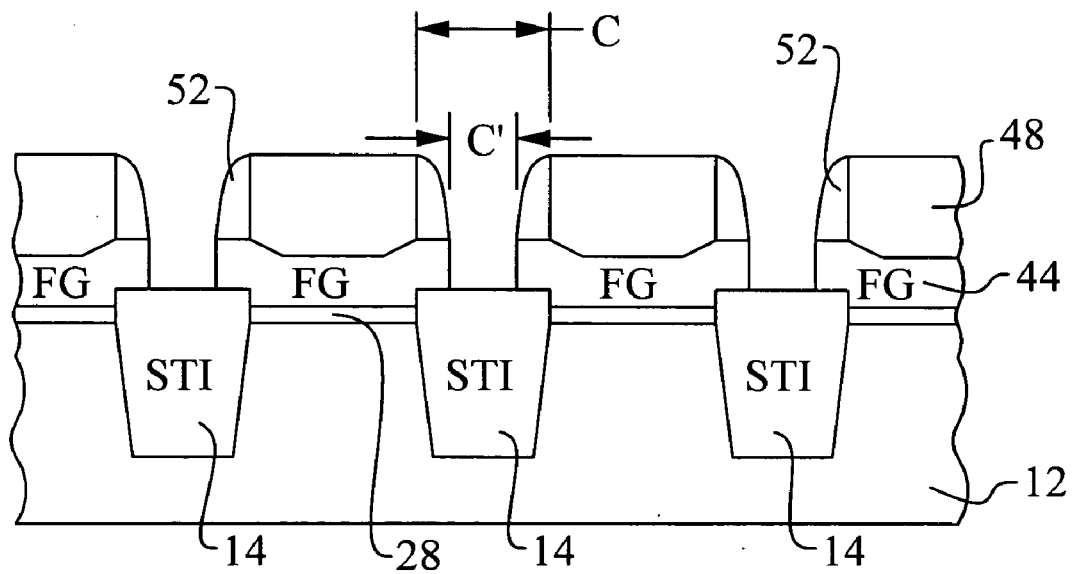
Figure 9:
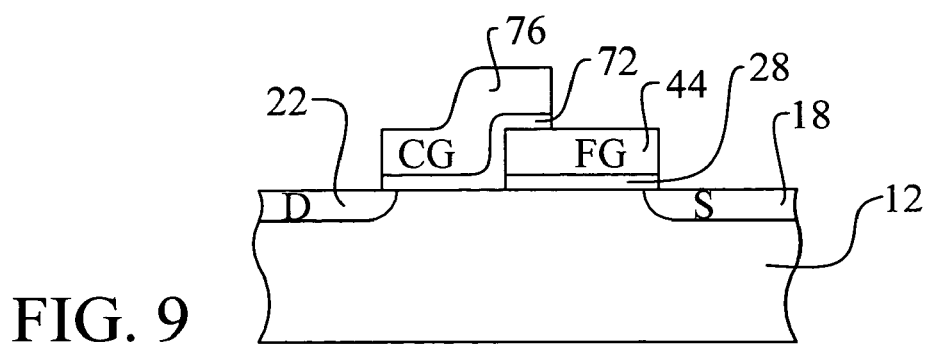

Referring now to FIG. 9, an alternative cross section of the memory array of FIG. 3 is shown. This cross section shows a single device in the direction parallel with the active area. Further, the device shows the results of subsequent processing steps following the definition of the floating gate as depicted in FIGS. 5 through 8. In subsequent process steps, a control gate 76 is defined. First, a second dielectric layer 72 is deposited overlying the substrate 12 and the floating gate 44. This second dielectric layer 72 may, for example, comprise an oxide layer or may comprise a composite layer of oxide-nitride-oxide (ONO) as is well known in the art. A second conductor layer 76 is then deposited overlying the second dielectric layer 72. The second conductor layer 76 preferably comprises polysilicon. The second conductor layer 76 is patterned to form the control gate 76 as shown. Note that, in the preferred embodiment, the control gate (CG) 76 is formed overlying the floating gate (FG) 44 in one part of the device and is formed directly overlying the channel region in a second part of the device. Source regions 22 and drain regions 18 are then formed using ion implantation as is well known in the art. LDD regions and spacers, not shown, may be added as deemed essential by the technology and as is well known in the art. The resulting split gate, EEPROM device is shown.

The advantages of the present invention may now be summarized. An effective and very manufacturable method to form narrowly-spaced transistor gates in an integrated circuit device is achieved. The method is extendible to forming narrowly-spaced floating gates for non-volatile memory. The method does not require the use of an extra precision photolithography process. The method does not require adding a spacer process. The method does not create OD trenches.

As shown in the preferred embodiments, the novel method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a transistor gate in the manufacture of an integrated circuit device, said method comprising:
   providing a substrate;
   forming a conductor layer overlying said substrate with a dielectric layer therebetween;
   forming a masking layer overlying said conductor layer;
   forming a resist layer overlying said masking layer;

patterning said resist layer to thereby selectively expose said masking layer wherein said resist layer exhibits a first spacing between edges of said resist layer;

etching through said exposed masking layer to thereby selectively expose said conductor layer wherein etched edges of said masking layer are tapered and the angle of the edges of said masking layer with respect to the top surface of said substrate is between about 45° and about 85° such that said masking layer exhibits a second spacing between said masking layer edges at the top surface of said conductor layer and wherein said second spacing is less than said first spacing; and etching through said exposed conductor layer to thereby complete a transistor gate.

2. The method according to claim 1 wherein said conductor layer comprises polysilicon.

3. The method according to claim 1 wherein said masking layer comprising silicon nitride.

4. The method according to claim 1 wherein said step of etching through said exposed masking layer comprising a dry etch further comprising an etching chemistry of $CFH_3$, $CF_4$, $O_2$, and He.

5. The method according to claim 1 wherein said masking layer comprising a thickness of between about 600 Å and about 4,000 Å.

6. The method according to claim 1 further comprising forming an isolation region in said substrate wherein said masking layer etched edges overlies said isolation region.

7. The method according to claim 1 wherein said transistor gate is a floating gate of a non-volatile memory device.

8. The method according to claim 7 further comprising:
forming a control gate overlying said floating gate wherein said control gate comprises a second conductor layer overlying a second dielectric layer; and
forming source and drain regions in said substrate.

9. A method to form floating gate of a non-volatile memory device, said method comprising:
providing a substrate;
forming an isolation region in said substrate;
forming a conductor layer overlying said substrate with a dielectric layer therebetween;
forming a masking layer overlying said conductor layer;
forming a resist layer overlying said masking layer;
patterning said resist layer to thereby selectively expose said masking layer wherein said resist layer exhibits a first spacing between edges of said resist layer;
etching through said exposed masking layer to thereby selectively expose said conductor layer wherein etched edges of said masking layer are tapered such that said masking layer exhibits a second spacing between said masking layer edges at the top surface of said conductor layer and wherein said second spacing is less than said first spacing and wherein said masking layer etched edges overlies said isolation region; and
etching through said exposed conductor layer to thereby complete a floating gate of a non-volatile memory device.

10. The method according to claim 9 wherein said conductor layer comprises polysilicon.

11. The method according to claim 9 wherein said masking layer comprising silicon nitride.

12. The method according to claim 9 wherein said step of etching through said exposed masking layer comprising a dry etch further comprising an etching chemistry of $CFH_3$, $CF_4$, $O_2$, and He.

13. The method according to claim 9 wherein the angle of the edges of said masking layer with respect to the top surface of said substrate is between about 45° and about 85°.

14. The method according to claim 9 wherein said masking layer comprising a thickness of between about 600 Å and about 4,000 Å.

15. The method according to claim 9 further comprising:
forming a control gate overlying said floating gate wherein said control gate comprises a second conductor layer overlying a second dielectric layer; and
forming source and drain regions in said substrate.

16. A method to form floating gate of a non-volatile memory device, said method comprising:
providing a substrate;
forming a shallow trench isolation in said substrate;
forming a polysilicon layer overlying said substrate with a dielectric layer therebetween;
forming a masking layer overlying said polysilicon layer;
forming a resist layer overlying said masking layer;
patterning said resist layer to thereby selectively expose said masking layer wherein said resist layer exhibits a first spacing between edges of said resist layer;
etching through said exposed masking layer to thereby selectively expose said polysilicon layer wherein etched edges of said masking layer are tapered such that said masking layer exhibits a second spacing between said masking layer edges at the top surface of said polysilicon layer and wherein said second spacing is less than said first spacing and wherein said masking layer etched edges overlies said isolation region;
etching through said exposed polysilicon layer to thereby complete a floating gate;
forming a control gate overlying said floating gate wherein said control gate comprises a second conductor layer overlying a second dielectric layer; and
forming source and drain regions in said substrate to complete a non-volatile device.

17. The method according to claim 16 wherein said step of etching through said exposed masking layer comprising a dry etch further comprising an etching chemistry of $CFH_3$, $CF_4$, $O_2$, and He.

18. The method according to claim 16 wherein the angle of the edges of said masking layer with respect to the top surface of said substrate is between 45° and about 85°.

19. The method according to claim 16 wherein said masking layer comprising a thickness of between about 600 Å and about 4,000 Å.

* * * * *